United States Patent
Kumaki

(12) 
(10) Patent No.: US 6,629,278 B1
(45) Date of Patent: Sep. 30, 2003

(54) COMPRESSED DATA RESTORATION APPARATUS, SEMICONDUCTOR TESTER EQUIPPED WITH SAME, AND DATA COMPRESSION/RESTORATION METHOD

(75) Inventor: Norio Kumaki, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/536,337

(22) Filed: Mar. 25, 2000

(30) Foreign Application Priority Data

Mar. 29, 1999 (JP) ............................................ 11-087161

(51) Int. Cl.[7] .............................................. G01R 31/28
(52) U.S. Cl. ........................................ 714/732; 714/710
(58) Field of Search ................................. 714/732, 710, 714/711

(56) References Cited

U.S. PATENT DOCUMENTS 4,866,440 A * 9/1989 Tsukiyama et al. ............ 341/95
5,257,327 A * 10/1993 Hirosawa ..................... 382/56

* cited by examiner

*Primary Examiner*—Phung M. Chung
(74) *Attorney, Agent, or Firm*—Muramatsu & Associates

(57) ABSTRACT

A compressed data restoration apparatus comprises a first storage unit 10 for storing therein a main file 20 composed of a plurality of unit files 24 each including a compressed data row 28 and control data 26 required for restoration thereof, each unit file 24 provided for each compressed data row 28, the main file 20 containing dummy data 26$x$ in place of the dynamic control data to be acquired after generation of the compressed data rows; a second storage unit 12 for storing therein a sub-file 22 containing the dynamic control data 30; a substituted control data generation unit 14 for substituting the dummy data with the dynamic control data to generate the substituted control data 32; and a restoration processor 16 for restoring the compressed data rows with use of the substituted control data. A plurality of the compressed data rows are restored in sequence at a high speed so as to reduce the time required for the restoration.

20 Claims, 8 Drawing Sheets

COMPRESSED DATA RESTORATION APPARATUS, SEMICONDUCTOR TESTER EQUIPPED WITH SAME, AND DATA COMPRESSION/RESTORATION METHOD

TECHNICAL FIELD

The present invention relates to a technique of compressed data restoration processing for restoring the compressed data such as the test pattern data which were transferred to a semiconductor tester in succession and at a high speed.

BACKGROUND ART

It has widely been made that data is temporarily compressed for the purpose of the data transfer and the like, and thereafter the thus compressed data is restored (decompressed). Restoration processors (typically compression/restoration processors) have been in common use for such restorations of the compressed data.

Referring herein to FIG. 8, a conventional example of a technique for restoring the compressed data will be described for the better understanding of the present invention. FIG. 8 is a block diagram for explaining a method for conventional compressed data restoration.

In cases where a compressed data row 280 is restored by a restoration processor 16 to generate a restored data row 340, it is commonly necessary to input restoration processor control data 84 into the restoration processor 16. Such restoration processor control data 84 includes, for example the size (bit number) of the compressed data row (sometimes called "a quantity of the compressed data row") and the size (bit number) of the pre-compression source data row (sometimes called "a quantity of the pre-compression source data row"). Also, the data input (hereinafter sometimes called "programming") is carried out by using a control software 82 which operates on a control processor 80.

Then, when the compressed data row 280 is fed to the restoration processor 16 into which the restoration processor control data 84 has been programmed, the restored data row 340 is generated. After the completion of the restoration processing of the compressed data row 280, the restoration processor 16 provides a restoration termination notice 86 to the control processor 80. In response to this restoration termination notice 86, the control software 82 starts the programming for allowing the restoration processor 16 to perform restoration processing of the next compressed data row.

Here, the reason will be described that the control software is troublesomely required each time the control data is programmed into the restoration processor.

In sequential writing of compressed data rows into the transferee storage device, none of control data has been acquired at the stage of the compression processing. Furthermore, in order to restore the compression data rows by means of the restoration processor, there is a need for control data to be programmed into the restoration processor prior to the entry of the compressed data rows. As a result of this, upon restoration of a compressed data row, it is necessary to separately perform the operation to retrieve control data corresponding to the compressed data row and to enter and program the thus retrieved control data into the restoration processor. For this reason, the control software is needed for execution of the retrieval or other processing.

As described above, in the conventional compressed data row restoration, the restoration processor control data must be individually programmed by means of the control software on a compressed data row basis. This means that, accordingly, as the number of the compressed data rows becomes larger, the number of operating times of the control software will also increase. Also, the operation of the control software needs a certain time for the programming, and correspondingly the restoration processing speed will become lower. This resulted in a deficiency that too much time is required for the restoration processing in the case for restoring a large number of compressed data rows in succession.

A plurality of the compressed data rows to be restored in succession in this manner include, typically, test pattern data for use in a semiconductor tester. In this case that the test pattern data, which is dedicated to semiconductor integrated circuits and which is used for testing, is transferred as compressed data to the semiconductor tester, the semiconductor tester carries out the semiconductor testing with use of the test pattern data restored through the restoration processing.

However, in the case of using an enormous quantity of test pattern data, the time taken for the restoration of the compressed data may possibly become much longer than the time needed for the semiconductor testing. In addition, the semiconductor testers can not test the integrated circuits during the restoration processing. Thus, for effective utilization of the costly semiconductor tester, it has been desired to reduce the time required for the restoration processing through its speed-up.

The present invention was conceived with the aim of solving the above problems. It is therefore an object of the present invention to provide a method and apparatus to restore the plural compressed data rows in succession at a high speed for reducing the time taken for the restoration.

SUMMARY OF THE INVENTION

In order to achieve the above object, according to the present invention, there is provided a compressed data restoration apparatus, which is designed to restore the plural compressed data rows obtained by a compression process for the plural source data rows, to generate the plural restored data rows.

Namely, the present invention provides a compressed data restoration apparatus, which comprises;

a first storage unit for storing therein a main file composed of the plural unit files each including a compressed data row and control data required for restoration thereof, each unit file provided for each compressed data row, the main file containing the dummy data in place of the dynamic control data to be acquired after generation of the compressed data rows;

a second storage unit for storing therein a sub-file containing the dynamic control data acquired from the control data for the compressed data rows after generation of the compressed data rows;

a substituted control data generation unit which upon the generation of restored data rows by restoration of the compressed data rows, reads out the unit files from the first storage unit and the dynamic control data from the second storage unit so as to substitute the dummy data of the control data with the dynamic control data in the sub-file for each of the unit files to thereby generate the substituted control data;

and a restoration processor which accepts the compressed data row and the substituted control data from the control data generation unit for each of the unit files so as to restore the compressed data rows by use of the substituted control data to thereby generate restored data rows.

In this manner, according to the compressed data restoration apparatus of the present invention, the main file contains in advance the plural unit files each containing a compressed data row and control data therefor in pairs so that the compressed data rows are restored on a unit file basis. To this end, upon the restoration of the compressed data rows, the compressed data rows are correlated in advance with the control data therefor. As a result, without taking the trouble to retrieve control data corresponding to the compressed data rows by use of the control software in the prior art, the corresponding control data can be programmed to the restoration processor.

Incidentally, the control data includes the dynamic control data to be acquired after generation of the compressed data. This dynamic control data is unknown at the stage of creating the unit files in the main file. In the present invention, for this reason, each unit file stores the dummy data in place of the dynamic control data, whereas the sub-file is created which holds each dynamic control data corresponding to each compressed data row. Then, upon restoration of the compressed data, the dummy data is substituted with the dynamic control data to generate the substituted control data.

Accordingly, according to the present invention, the compressed::data can be restored by programming the substituted control data corresponding to the compressed data rows into the restoration processor. This results in no need for any trouble of operation of the control software for each compressed data row, achieving a reduction in time taken for the restoration processing.

Furthermore, in the compressed data restoration apparatus of the present invention, preferably, each of the unit files in the main file contains, as headers of the control data and of the compressed data row, positional information indicative of the site to store the control data and the compressed data row in the restoration processor.

In this manner, by allowing each unit file to contain positional information indicative of the site to store each data in the restoration processor, it is possible to easily enter the control data and compressed data rows into the restoration processor on the basis of this positional information, without using any control software.

Moreover, in the compressed data restoration apparatus of the present invention, preferably the substituted control data generation unit comprises;

a separation unit for separating the unit files read out from the first storage unit into the compressed data rows and the control data to provide the compressed data rows as its output to the restoration processor;

an array unit for allowing the sequence of output of each of the dynamic control data read out collectively from the second storage unit to coincide with sequence of output from the separation unit of the dummy data to be substituted by the dynamic control data; and a substitution unit for substituting the dummy data output from the separation unit with the dynamic control data output one after another from the array unit to generate the substituted control data for the output to the restoration processor.

In this manner, by allowing the sequence of the dynamic control data with the sequence of the dummy data in the array unit, the substitution unit has merely to mechanically read out the dynamic control data one after another to thereby achieve an easy substitution with the dummy corresponding thereto. It is thus possible to perform the restoration processing easily without any trouble to use the control software for each of compressed data rows.

Furthermore, in the compressed data restoration apparatus of the present invention, the separation unit preferably judges as to whether the data in question is the control data or the compressed data row on the basis of respective positional information on the control data and the compressed data row of the unit files in the case that the unit files each contain the positional information.

In this manner, by distinguishing the control data from the compressed data row in each unit file on the basis of the positional information in the separation unit, the control data and the compression data row can easily be separated from each other.

According to the present invention, there is also provided a semiconductor tester provided with a compressed data restoration apparatus designed to restore the plural compressed data rows transferred, to generate test pattern data for testing of the semiconductor integrated circuits, wherein the compressed data restoration apparatus comprises;

a first storage unit for storing therein a main file composed of the plural unit files each including a compressed data row and control data required for restoration thereof, each unit file provided for each compressed data row, the main file containing the dummy data in place of the dynamic control data to be acquired after generation of the compressed data rows;

a second storage unit for storing therein a sub-file containing the dynamic control data acquired from the control data for the compressed data rows after generation of the compressed data rows;

a substituted control data generation unit which upon the generation of restored data rows by restoration of the compressed data rows, reads out the unit files from the first storage unit and the dynamic control data from the second storage unit so as to substitute the dummy data of the control data with the dynamic control data in the sub-file for each of the unit files to thereby generate the substituted control data; and a restoration processor which accepts the compressed data row and the substituted control data from the control data generation unit for each of the unit files so as to restore the compressed data rows by use of the substituted control data to thereby generate restored data rows.

Thus, according to the present invention, the plural compressed data rows are restored in succession at a high speed so that the time required for the restoration can be reduced, thereby offering a longer actual operation time to the semiconductor tester.

Further more, according to the presented semiconductor tester, each of the unit files preferably contains positional information indicative of the site to store the control data and the compressed data row in the restoration processor as headers of the control data and of the compressed data row in the main file.

By allowing each unit files to contain positional information in this manner, the control data and the compressed data rows can readily be input to the restoration processor without using the control software in the compressed data restoration apparatus of the semiconductor tester.

Moreover, according to the presented semiconductor tester, the substituted control data generation unit preferably comprises;

a separation unit for separating the unit files read out from the first storage unit into the compressed data rows and the control data to provide the compressed data rows as its output to the restoration processor;

an array unit for allowing the sequence of output of each of the dynamic control data read out collectively from the second storage unit to coincide with sequence of output from the separation unit of the dummy data to be substituted by the dynamic control data; and a substitution unit for substituting the dummy data output from the separation unit with the dynamic control data output one after another from the array unit to generate the substituted control data for the output to the restoration processor.

By allowing the sequence of the dynamic control data with the sequence of the dummy data in the array unit in this manner, the substitution unit has merely to mechanically read out the dynamic control data one after another to thereby achieve an easy substitution with the dummy corresponding thereto. It is thus possible to perform the restoration processing easily without any troubles to use the control software for each of compressed data rows in the compressed data restoration apparatus of the semiconductor tester.

According to the present invention, there is further provided a data compression/restoration method comprising the step of generating a main file which contains the plural compressed data rows, and a sub-file which contains the dynamic control data acquired after generation of the compressed data rows from the control data required when restoration of the compressed data rows, based on the plural compressed data rows produced through a compression process of the plural source data rows;

and the step of substituting the dummy data with the dynamic control data in the sub-file for each compressed data to generate the substituted control data, and restoring the compressed data rows by use of the substituted control data associated therewith, for generating the plural restored data rows through a restoration process of the plural compressed data rows.

According to the data compression/restoration method of the present invention in this manner, the main file can store a large volume of the compressed data and the control data which includes the dynamic control data as the dummy data, and such dummy data can be substituted with the dynamic control data in the sub-file when the restoration is carried out.

This will enable the control data to be programmed to the restoration processor without using any control software. In consequence, due to no operation of the control software for each compressed data, the need time for the restoration can be reduced by restoring the plural compressed data rows in succession at a high speed.

Furthermore, according to the data compression/restoration method of the present invention, the sequence of restoration of the compressed data rows is preferably coincided with the sequence of array immediately before substitution of the dynamic control data corresponding to the compressed data row, when the substituted control data is generated.

By effecting the substitution in the condition that the coincidence of the sequence of restoration of the compressed data with the sequence of array of the dynamic control data, the dynamic control data has only to be read out mechanically one after another so that easy substitution with the corresponding dummy data will be ensured. For this reason, the restoration processing can easily be executed without any trouble to use the control software on a compressed data row basis.

DETAILED DESCRIPTION OF THE INVENTION

An embodiment of the present invention will now be described with reference to the drawings.

Figure 1:
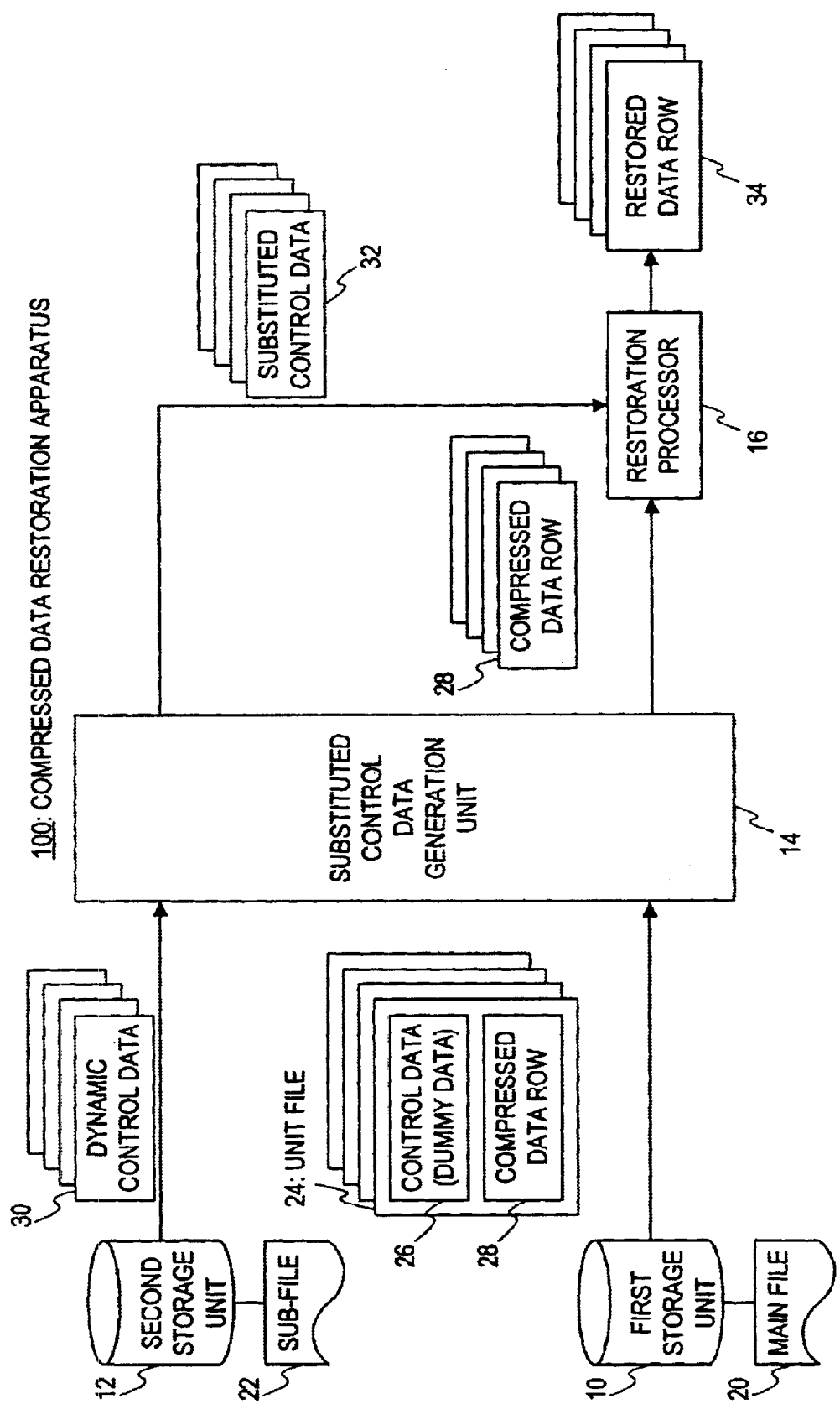
FIG. 1 is a block diagram for explaining the schematic configuration of a compressed data restoration apparatus in accordance with an embodiment.

Referring first to FIG. 1, description will be made of a compressed data restoration apparatus in accordance with the embodiment.

FIG. 1 is a block diagram for explaining the configuration of the compressed data restoration apparatus of the embodiment.

As illustrated in FIG. 1, the compressed data restoration apparatus 100 of this embodiment serves to restore the plural compressed data rows obtained by compressing the plural source data rows. The compressed data restoration apparatus 100 comprises a first storage unit 10, a second storage unit 12, a substituted control data generation unit 14 and a restoration processor 16.

The first storage unit 10 is comprised of a disk storage and serves to store a main file 20. The second storage unit 12 is also comprised of a disk storage and serves to store a sub-file 22.

1. Main File

Figure 2:
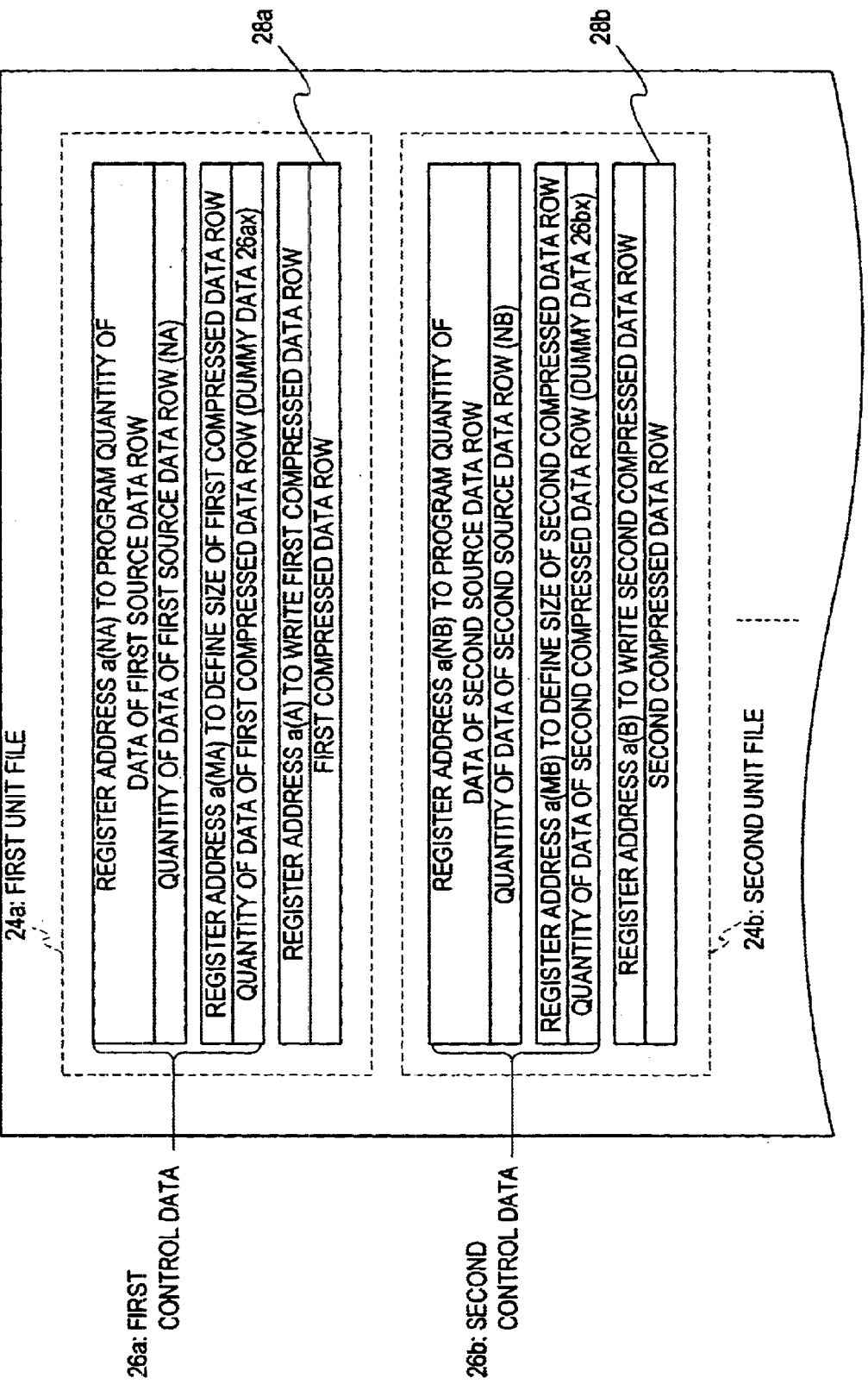
FIG. 2 is an explanatory diagram of the data configuration of a main file in accordance with the embodiment.

Referring herein to FIG. 2, description is made of the data configuration of the main file 20.

FIG. 2 is a data configuration diagram which is a part of the main file 20. As illustrated in FIG. 2, the main file 20 is composed of a unit file 24 for each compressed data row 28.

It is to be noted in FIG. 2 that of unit files 24 constituting the main file 20, the first unit file 24a and the second unit file 24b are illustrated in a representative manner, with the illustration of third and subsequent files omitted.

Then, each unit file contains a compressed data row 28 and control data 26 necessary for the restoration of the compressed data row 28. This means that the main file 20 stores therein sets of the compressed data rows 28 and the control data 26 in advance.

More specifically, as seen in FIG. 2, the first unit file 24a contains both of a first compressed data row 28a and first control data 26a. The second unit file 24b contains both of a second compressed data row 28b and second control data 26b.

It is to be noted that each control data 26 is stored at the forefront of each compressed data row 28.

Further, in this embodiment, the main file 20 stores "quantity of data of source data row (N)" and "quantity of data of compressed data row (M)" as the control data 26.

More concretely, as illustrated in FIG. 2, the first unit file 24a includes the first control data 26a such as "quantity of data of first source data row (NA)" and "quantity of data of first compressed data row (MA)". Similarly, the second unit file 24b includes the second control data 26b such as "quantity of data of second source data row (NB)" and "quantity of data of second compressed data row (MB)".

Also, the main file 20 stores the dummy data 26x as the control data 26 in place of the "quantity of data of compressed data row (M)" which is the dynamic control data acquired after the generation of the compressed data row 28.

More specifically, as seen in FIG. 2, the first control data 26a of the first unit file 24a includes the dummy data 26ax in place of the quantity of data of first compressed data row. Similarly, the second control data 26b of the second unit file 24b includes the dummy data 26bx in place of the quantity of data of the second compressed data row.

Each unit file 24 of the main file 20 further includes headers of each compressed data row 28 and each control data 26, the headers being provided in the form of the positional information indicative of sites (locations) to store the control data 26 and the compressed data row 28 in the restoration processor 16.

More specifically, at the forefront of the "quantity of data of first source data row (NA)" block of the first control data 26a, the first unit file 24a stores a register address a(NA) to program the quantity of data (NA) into the restoration processor 16.

Similarly, at the forefront of the "quantity of data of first compressed data row" block in which the dummy data 26ax is stored, of the first control data 26a, there is stored a register address a(MA) in which this quantity of data is programmed and which is for defining the size of the first compressed data row.

Furthermore, at the forefront of the block of the first compressed data row 28a, there is stored a register address a(A) to write this first compressed data row 28a in the restoration processor 16.

Similar to the first unit file 24a, at the forefront of the block of the "quantity of data of second source data row (NB)" of the second control data 26b, the second unit file 24b stores a register address n(NB) to program this quantity of data (NB) into the restoration processor 16.

Similarly, at the forefront of the "quantity of data of second compressed data row" block in which the dummy data 26bx is stored, of the second control data 26b, there is stored a register address a(MB) to program this quantity of data for defining the size of the second compressed data row.

Furthermore, at the forefront of the block of the second compressed data row 28b, there is stored a register address a(B) to write this second compressed data row 28a in the restoration processor 16.

Although in this embodiment each unit file 24 includes direct positional information in the form of the addresses by way of example, the positional information of the present invention is not limited thereto. The positional information could be provided in the form of notices indicative of the address storage regions in the restoration processor for example.

2. Sub-file

Figure 3:
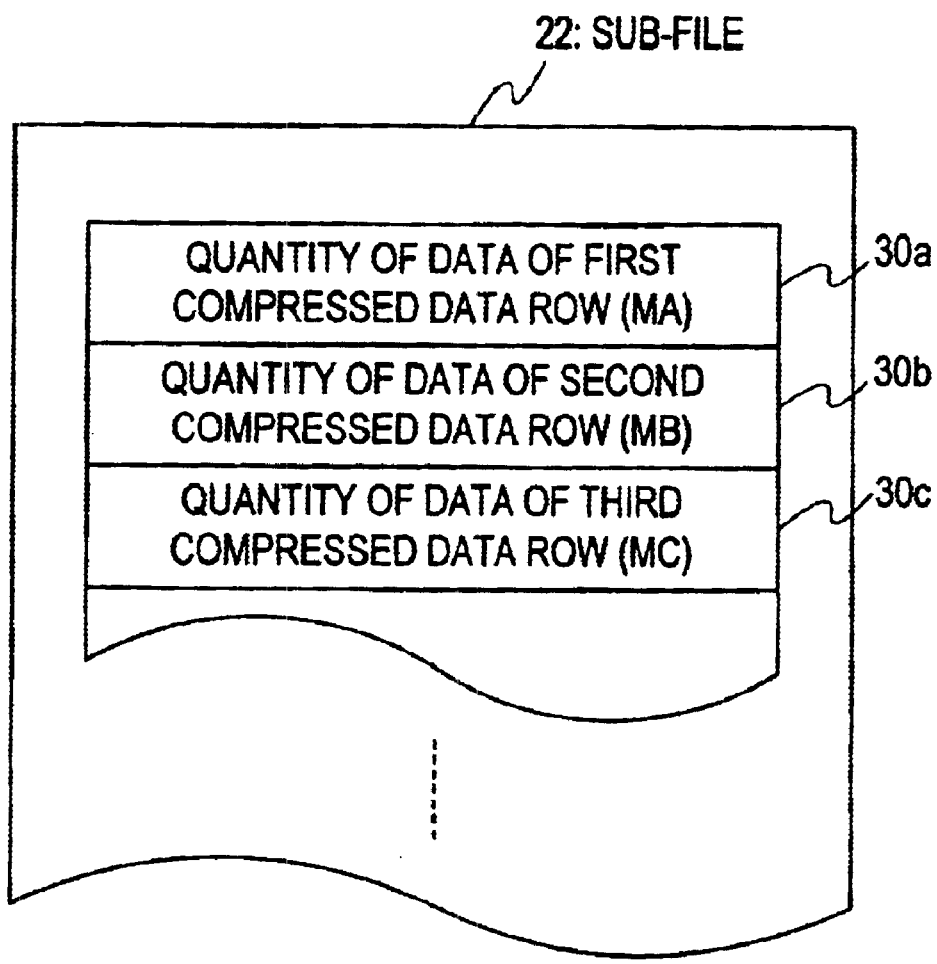
FIG. 3 is an explanatory diagram of the data configuration of a sub-file in accordance with the embodiment.

Referring then to FIG. 3, the description will be made of the data configuration of a sub-file 22.

FIG. 3 is a data configuration diagram which is a part of the sub-file 22. As can be seen in FIG. 3, the sub-file 22 stores therein each dynamic control data 30 acquired after the writing of the compressed data rows as the main file into the first storage unit, of the control data for each compressed data row.

In this embodiment, each dynamic control data 30 is stored in the sub-file 22 so as to be arrayed in the sequence corresponding to the sequence of array of the unit files 24 in the main file 20.

More specifically, correspondingly to the unit files arrayed in the sequence of the first unit file 24a and second unit file 24b in the main file 20 as shown in FIG. 2, the dynamic control data 30 is arranged in the sequence of "quantity of data of first compressed data row (MA)" 30a, "quantity of data of second compressed data row (MB)" 30b, and "quantity of data of third compressed data row (MC)" 30c as seen in FIG. 3.

3. Substituted Control Data Generating Unit

Next, the description will be made of the substituted control data generation unit 14.

For generation of the restored data rows 34 as a result of restoration of-the compressed data rows 28, the substituted control data generation unit 14 reads out the unit files 24 one after another from the first storage unit 10, while it reads out the dynamic control data 30 at a time from the second storage unit 12. In other words, the unit files 24 are read out one by one in the sequence of restoration, whereas the dynamic control data 30 is read out collectively without exception for example.

Then, for each unit file 24, the substituted control data generation unit 14 substitutes the dummy data 26x of the control data 26 with the dynamic control data 30 to generate the substituted control data 32.

It will be appreciated in the restoration processing that all the unit files 24 within the main file 20 may be read out one after another or that some, i.e., a portion of the unit files 24 may be read out in a selective manner. The sequence of readout of the unit files 24 may be same as or different from the sequence of array thereof within the main file 20.

For ease of illustration, this embodiment will be described by way of an example in which all the unit files 24 within the main file 20 are read out one after another from the foremost one in accordance with the sequence of array within the main file 20.

Figure 4:
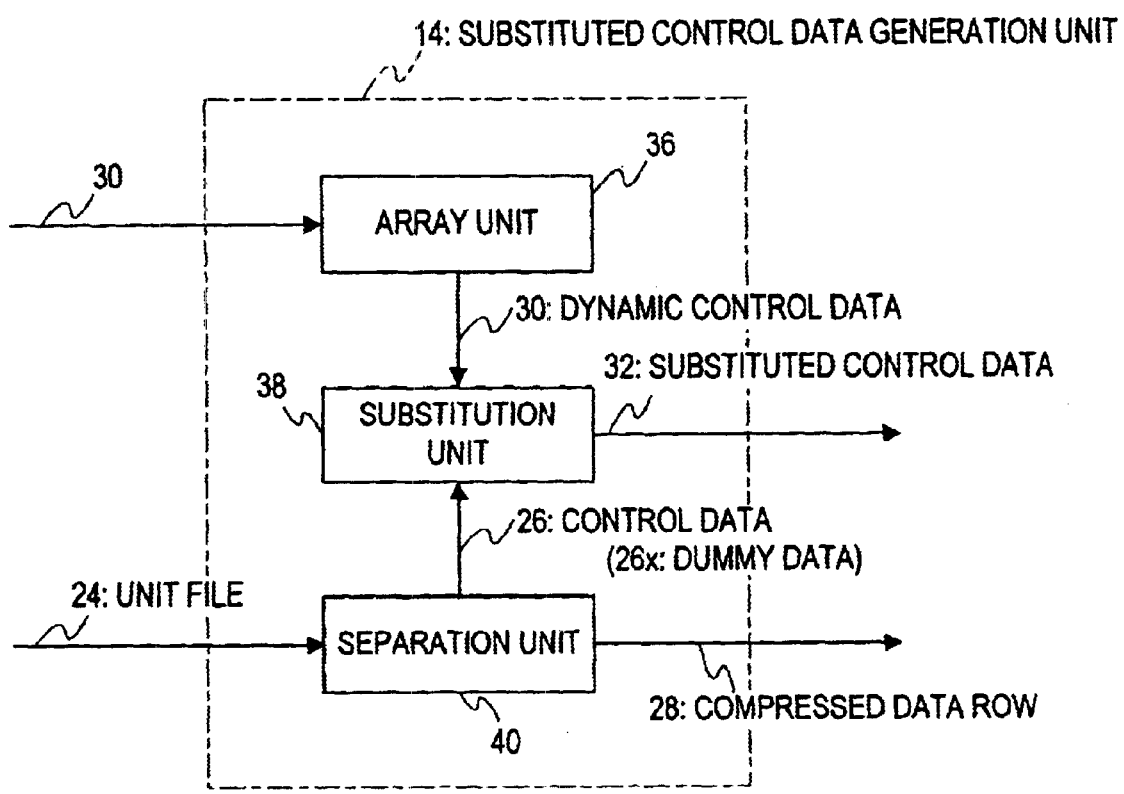
FIG. 4 is a function block diagram for explaining the configuration of a substituted control data generation unit in accordance with the embodiment.

Referring herein to FIG. 4, the description will be made in greater detail of the substituted control data generation unit 14.

FIG. 4 is a function block diagram for explaining the configuration of the substituted control data generation unit of this embodiment. As illustrated in FIG. 4, this substituted control data generation unit 14 comprises a separation unit 40, an array unit 36 and a substitution unit 38.

3.1 Separation Unit

The unit files 24 read out from the first storage unit 10, are input to the separation unit 40. Then, the unit files 24 are separated by this separation unit 40 into the compressed data rows 28 and the control data 26.

For example, when the separation unit 40 accepts the first unit file 24a as shown in FIG. 2, the separation unit 40 judges from the foremost address of each data as to whether that data is the compressed data row 28 or the control data. 26. That is, if the address is the "register address a(A) to write the first compressed data row", then the separation unit 40 judges that the data is the compressed data row 28. On the contrary, if the address is for example the "register address a(NA) to program the quantity of data of the first source data row" or "register address a(MA) to define the size of the first compressed data row", then the separation unit 40 judges that the data is the control data 26.

In the same manner, the separation unit 40 judges the second unit file 24b and the following unit files to separate them into the compressed data rows 28 and the control data 26.

Then, for each unit data 24, the control data 26 after separation is first output to the substitution unit 38. Subsequently, the compressed data row 28 after separation is output to the restoration processor 16.

In this embodiment, as described above, the unit files 24 are read out one after another from the foremost one in accordance with the sequence of array of the unit files 24 in the main file 20 (see FIG. 2). As a result of this, the sequence of the control data 26 input from the separation unit 40 to the substitution unit 38 will coincide with the sequence of array of the unit files 24. The dummy data 26x of the control data 26 is therefore fed to the substitution unit in the same sequence as the sequence of array of the unit files 24.

3.2 Array Unit

The array unit 36 on the other hand accepts each dynamic control data 30 read out collectively as the entire sub-file 22 from the second storage unit 12. Then, the array unit 36 allows the sequence of output of each dynamic control data 30 to the substitution unit 38 to coincide with the sequence of input to the substitution unit of the dummy data 26x to be substituted by that dynamic control data 30.

Figure 5A:
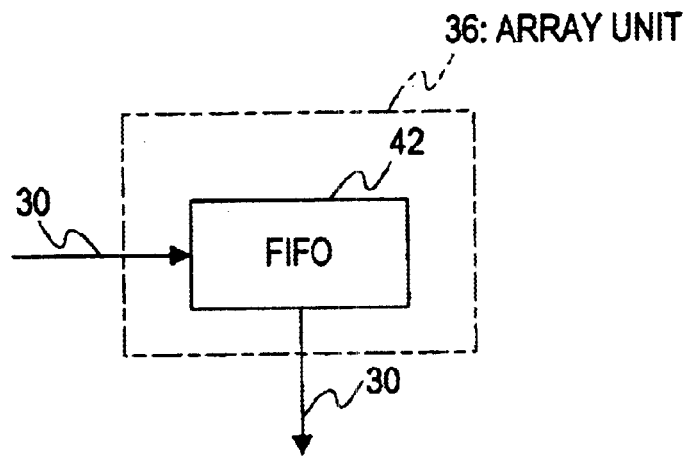
FIGS. 5(A) and 5(B) are function block diagrams for explaining the configuration of an array unit in accordance with the embodiment.

Referring herein to FIG. 5(A), the configuration of the array unit 36 will be described by way of example.

FIG. 5(A) illustrates an example in which a temporary memory is comprised of a first in first out memory (hereinafter, referred to also as FIFO) 42.

In this embodiment, as described above, the sequence of storage of data in the sub-file 22 coincides with the sequence of array of the corresponding unit files 24 in the main file 20 (see FIG. 3). More specifically, the sub-file 22 stores the dynamic control data 30 in the sequence of the "quantity of data of first compressed data row (MA)" 30a, the "quantity of data of second compressed data row (MB)" 30b, the "quantity of data of third compressed data row (MC)" 30c, etc. Then, in this embodiment, each dynamic control data 30 is read into the FIFO at a time from the foremost one.

As a result, in this embodiment, the dynamic control data 30 is output one after another from the FIFO to the substitution unit 38 in the same sequence as the sequence of array in the sub-file 22. This allows the sequence of the dummy data 26x of the control data 26 input from the separation unit 40 to the substitution unit 38 to coincide with the sequence of the dynamic control data 30 input from the array unit 36.

By the way, the array unit 36 of the present invention is capable of re-arraying the dynamic control data 30 in the desired sequence of output. Re-array of the sequence of output will enable the dummy data to easily be substituted by the dynamic control data corresponding thereto, even in case that the sequence of the dynamic control data in the sub-file is different from the sequence of restoration of the unit files.

Figure 5B:
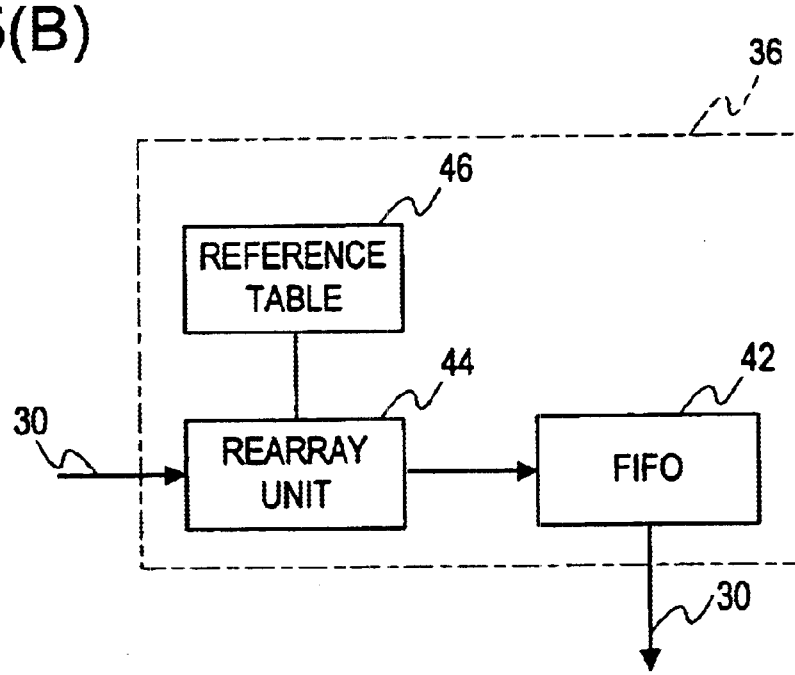

Referring herein to FIG. 5(B), a variant of the array unit 36 will be described.

FIG. 5(B) is a function block diagram showing the configuration of the modified array unit 36. As illustrated in FIG. 5(B), the modified array unit 36 is provided with a re-array unit 44 and a reference table 46 in addition to the FIFO 42.

In this reference table 46, each dynamic control data 30 is correlated with the sequence of output thereof from the array unit 36. For example, in the case of re-arraying the "quantity of data of first compressed data row (MA)" 30a, the "quantity of data of second compressed data row (MB)" 30b and the "quantity of data of third compressed data row (Mc)" 30c shown in FIG. 3 in the sequence of "MB" 30b, "MC" 30c and "MA" 30a, correlation may be provided as "MA→3", "MB→1" and "MC→2" through the reference table 46.

Reference numerals 1 to 3 respectively denote the sequence of output.

Then, the re-array unit 44 refers to the reference table 46 and enters the dynamic control data 30 into the FIFO 42 in the sequence of readout shown in reference table 46. For example, it re-arrays each dynamic control data 30 in the sequence of "MB" 30b, "MC" 30c and "MA" 30a and enters them into the FIFO 42. Then, the FIFO 42 provides each dynamic control data 30 as its output to the substitution unit 38 one after another in this sequence of re-arraying.

It is to be noted that the dynamic control data 30 could be re-arrayed by instruction of the software, for example, without using the reference table 46. Although in this case the software may operate in the restoration processing, this operation takes place only one time when each dynamic control data 30 is collectively read out from the second storage unit 12. Accordingly, in such a case as well, the restoration processing time can sufficiently be reduced as compared with the conventional case in which the software intervenes every time each compressed data row is restored.

3.3 Substitution Unit

The substitution unit 38 substitutes one after another the dummy data 26x of the control data 26 separated by the separation unit 40 with the dynamic control data 30 output in sequence from the array unit 36, to generate the substituted control data 32 for the programming into the processor.

Figure 6:
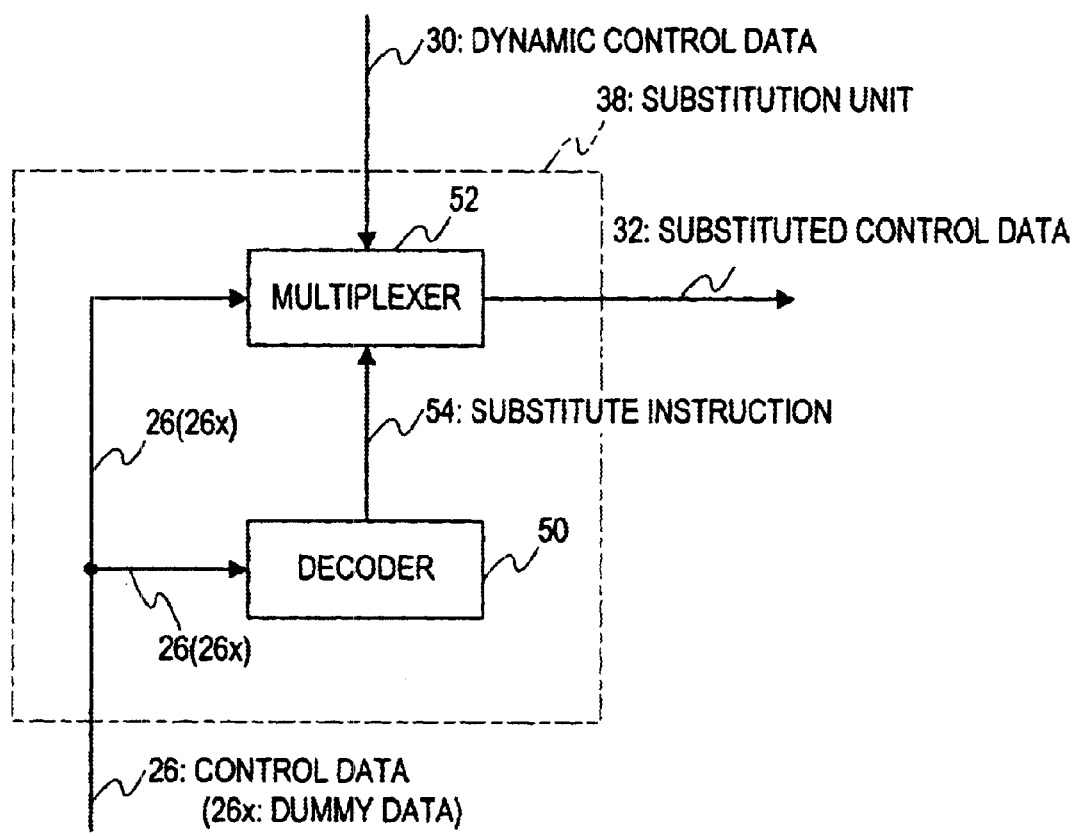
FIG. 6 is a block diagram for explaining the configuration of a substitution unit in accordance with the embodiment.

Referring herein to FIG. 6, an example of the configuration of the substitution unit 38 will be described.

FIG. 6 is a function block diagram for explaining the configuration of the substitution unit 38. As seen in FIG. 6, the substitution unit 38 of this configuration example comprises a decoder 50 and a multiplexer 52.

On the basis of positional information of the control data 26, the decoder 50 judges as to whether the control data 26 is the dummy data 26x or not. For example, in case of input to the decoder 50 of the first control data 26a after separation of the first unit file 24a shown in FIG. 2, the decoder 50 judges as to whether the control data 26a is the non-dynamic data or the dummy data 26ax from the forefront address of each control data 26a.

More specifically, if the address is for example the "register address a(NA) to program the quantity of data of the first source data row", then the decoder 50 judges the control data 26 to be non-dummy data. On the contrary, if the address is for example the "register address a(MA) to define the size of the first compressed data row", then the decoder 50 judges the control data 26 to the dummy data 26x.

It will be understood that the second control data 26b and the following other control data are also judged from the address in the same manner by the decoder 50.

Then, if that control data 26 is the dummy data 26x, then the decoder 50 provides a substitute instruction signal (detection signal) 54 to the multiplexer 52.

Simultaneously, the multiplexer 52 receives the same control data as the control data 26 input to the decoder 50. Then, in the absence of the substitute signal 54, the multiplexer 52 provides the control data 26 input in the form of the non-dummy data to the restoration processor 16 for the programming. On the contrary, upon the receipt of the substitute signal 54, the multiplexer 52 substitutes the dummy data 26x which has been input to the multiplexer at that point of time with the dynamic control data 30.

For this substitution, as described above, the sequence of output of the dynamic control data 30 is caused by the array unit 36 to coincide with the sequence of input of the dummy data 26x to the substitution unit 38, so that the multiplexer 52 has merely to read out mechanically the dynamic control data 30 one after another to thereby achieve automatic coincidence with the corresponding dummy data 26x. It is thus possible to easily substitute each dummy data 26 with the corresponding dynamic control data 30 without any trouble of operation of the software.

Then, the multiplexer 52 programs the restoration processor 16 with the thus substituted control data 26 as the substituted control data 32.

4. Restoration Processor

The restoration processor 16 for use in this embodiment can be a hitherto known restoration processor. Then, this restoration processor 16 accepts the substituted control data 32 from the substitution unit 38 of the substituted control data generation unit 14 and accepts the compressed data row 28 from the separation unit 40.

Each control data 26 is input and programmed to the location indicated by the forefront address of each control data 26. It is thus possible to easily program the corresponding control data into the restoration processor 16 without need to retrieve the control data corresponding to the compressed data row by using any software for control as in the prior art.

For example, in the event of input of the first control data 26a of the first unit file 24a shown in FIG. 2 in the form of the substituted control data 32, the "quantity of data (NA) of the first source data row" is written to the address indicated by the "register address a(NA) to program the quantity of data of the first source data row" at the forefront thereof. Furthermore, the "quantity of data (MA) of the first compressed data row" 30a in the form of the dynamic control data substituted by the dummy data 26ax is written to the address indicated by the "register address to define the Serial size of the first compressed data row" at the forefront thereof.

Then, using the programmed substituted control data 32, the restoration processor 16 restores the compressed data rows 28 to generate the restored data rows 34. For example, the first compressed data row 28a is written to the address indicated by the "register address a(A) to write the first compressed data row" at the forefront thereof. Then, using the programmed substituted control data 32, the restoration processor 16 restores the first compressed data row 28a to generate the restored data row 34.

Moreover, in this embodiment, upon the termination of the restoration of the first compressed data row 28a, the restoration processor 16 provides a termination notice to the substituted control data generation unit 14. In response to the termination notice, the substituted control data generation unit 14 reads out the second unit file 24b from the first storage unit 10, and in the same manner as the case of the first unit file 24a, generates the substituted control data 32 corresponding to the second compressed data row 28b. Then, the restoration processor 16 restores the second compressed data row 28b in the same manner as the restoration of the first compressed data row 28a.

Afterward, the third compressed data row and the following other compressed data rows are also in sequence restored in the same manner.

In this way, according to this compressed data restoration apparatus 100, it is possible to program the substituted control data 32 corresponding to the compressed data rows 28 into the restoration processor 16. This will allow the compressed data 28 to be restored without any trouble of operation of the control software for each compressed data row 28. As a result of this, the time required for the restoration processing can be reduced.

5. Semiconductor Tester

Figure 7:
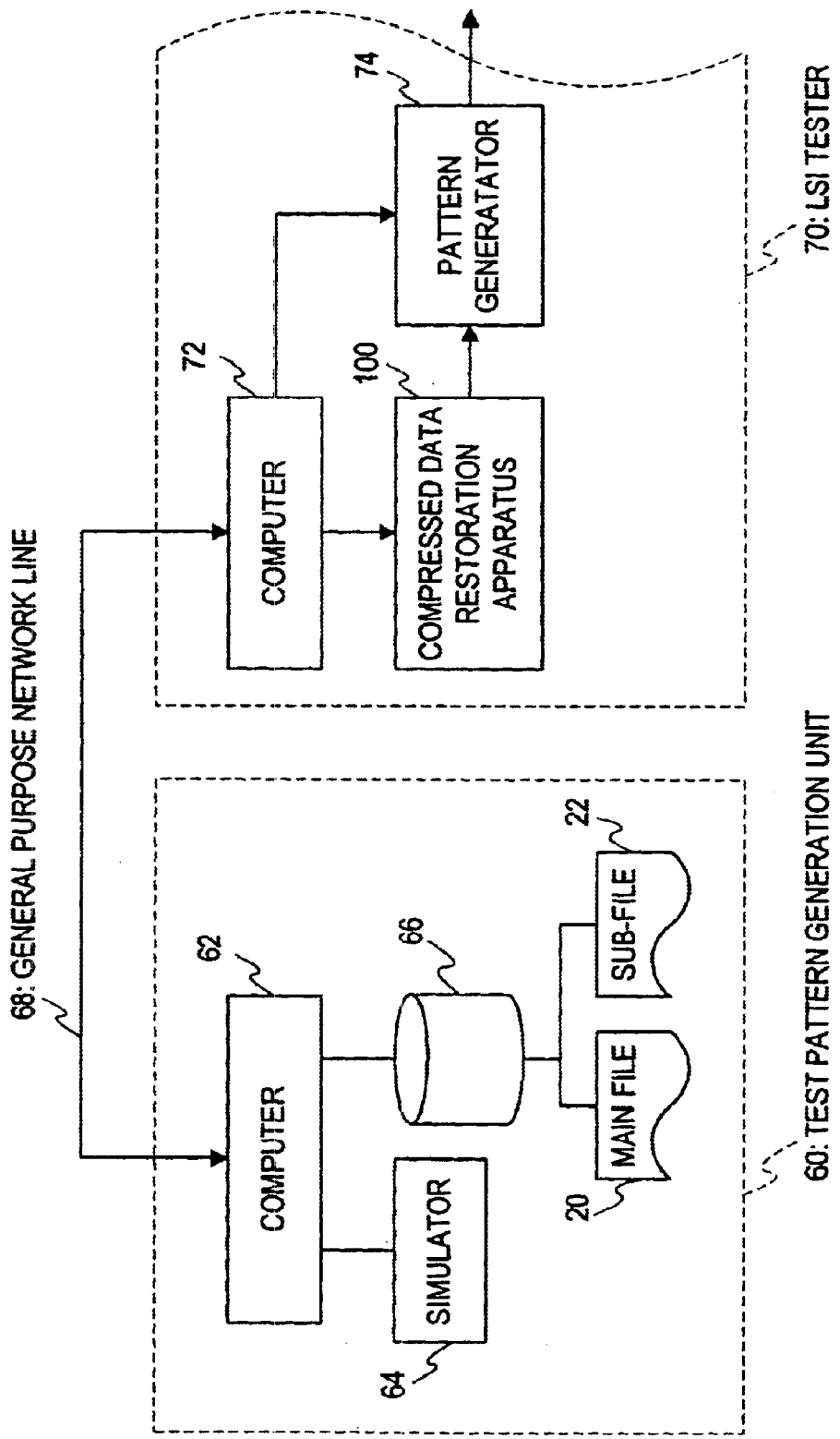
FIG. 7 is a block diagram for explaining the configuration of an LSI tester in accordance with the embodiment.
Figure 8:
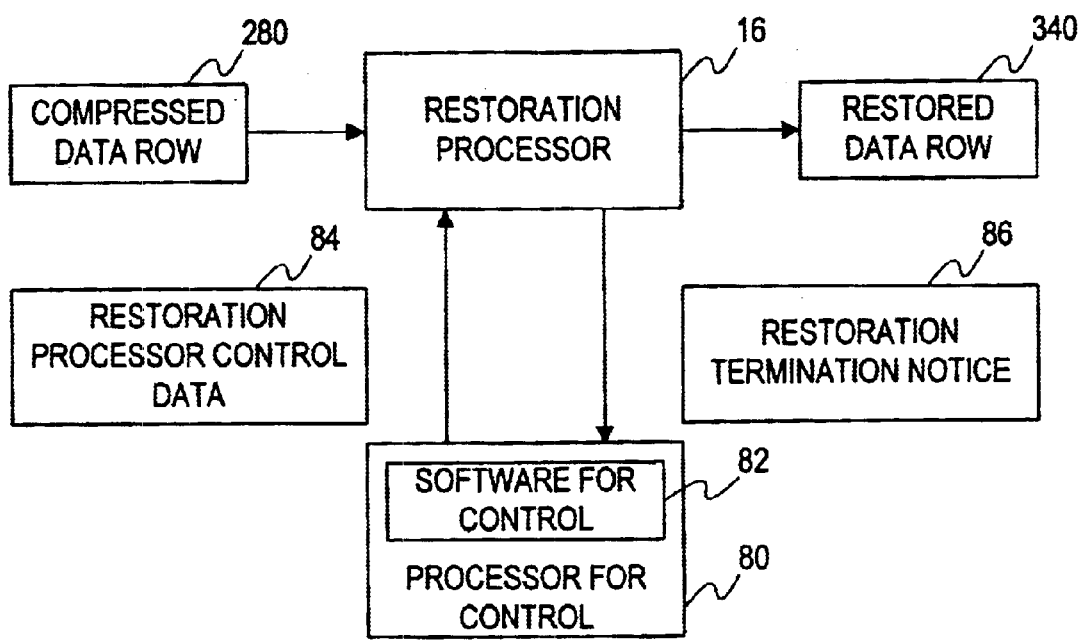
FIG. 8 is a block diagram for explaining a conventional compressed data restoration method.

Referring then to FIG. 7, description will be made of an example of a semiconductor tester (hereinafter referred to also as "LSI tester") 70 provided with the above compressed data restoration apparatus 100.

Since this LSI tester 70 has substantially the same configuration as that of the conventional LSI tester except the configuration of the part associated with the compressed data restoration apparatus 100, no detailed description will be made thereof.

Test pattern data for the testing of semiconductor integrated circuits is created by a test pattern data generation unit 60 in accordance with the semiconductor integrated circuits (LSI) to be tested. This test pattern data generation unit 60 is controlled by a computer 62. Then, under the control of this computer 62, a simulator 64 generates an enormous quantity of test pattern data in accordance with the LSIs to be tested.

The test pattern data is ordinarily classified from the functional viewpoint, for its management or other reasons. Then, the quantity of data of a single data row is of the order of 1 MB to 10 MB for example. Then, in order to check a single sort of semiconductor integrated circuits there are generated test pattern data consisting of several thousand data rows for example.

The thus generated test pattern data is transferred to the LSI tester via a general purpose network line 68. To reduce this quantity of data, the test pattern data is compressed. Since a large volume of repetitive data are included in the test pattern, the quantity of data can be reduced to a large extent by the compression. On the other hand, the number itself of the compressed data rows remains unchanged from that in the pre-compressed state, i.e., remains of the order of several thousands.

In compressing the test pattern data, the main file 20 having the memory configuration shown in FIG. 2, and the sub-file 22 having the memory configuration shown in FIG. 3 are generated. Then, the main file 20 and the sub-file 22 are temporarily stored in a storage unit 66 of the test pattern data generation unit 60.

After the transfer as the test pattern data from the test pattern data generation unit 60 to the LSI tester 70, the main file 20 and the sub-file 22 are stored respectively in the first storage unit 10 and the second storage unit 12 of the compressed data restoration unit 100 (see FIG. 1).

This LSI tester 70 is controlled by a computer 72. Then, under the control of this computer 72, the compressed data restoration apparatus 100 executes the restoration processing as descried above to generate test pattern data. For this restoration processing, several thousand compressed data files are restored in sequence although there is no need for the trouble of operation of the control software as in the prior art. For this reason, it is possible to reduce the restoration time to a large extent. In consequence, a longer actual operation time of the semiconductor tester can be secured.

Then, the thus restored test pattern data is written to a pattern generator 74 for use in the testing of the semiconductor integrated circuits.

Although in the above embodiment, description has been made of an example of the present invention configured in specific conditions, this invention can variously be modified. For example, in the above embodiment, description has been made of an example in which the control data includes two quantity of data, i.e., the quantity of data of the source data row and the quantity of data of the compressed data row, the number and the sort of data rows are not limited thereto in the present invention. Furthermore, the dynamic control data is not limited to only the quantity of data of the compressed data row. For example, each unit file may include the plural dynamic control data for each compressed data row.

Although in the above embodiment, description has been made of an example in which all the unit files 24 contained in the main file 20 are read out in sequence for execution of the restoration processing, the present invention need not be limited to the case of the restoration of all of the unit files. For example, some of the unit files in the main file may be read out selectively from the first storage unit. In such an event, it is preferred to read out the dynamic control data corresponding to those unit files in a selective manner from the second storage unit.

INDUSTRIAL APPLICABILITY

The present invention is suited for use in the semiconductor tester and the compressed data restoration apparatus making up the same, and further in the data compression and restoration method.

What is claimed is:

1. A compressed data restoration apparatus designed to restore a plurality of compressed data rows obtained by a compression process for a plurality of source data rows, to generate a plurality of restored data rows, said compressed data restoration apparatus comprising:

a first storage unit for storing therein a main file composed of a plurality of unit files each including a compressed data row and control data required for restoration thereof, each unit file being provided for each compressed data row, said main file containing dummy data in place of dynamic control data to be acquired after generation of the compressed data rows;

a second storage unit for storing therein a sub-file containing the dynamic control data acquired from the control data for the compressed data rows after generation of the compressed data rows;

a substituted control data generation unit which, upon generation of the restored data rows by restoration of said compressed data rows, reads out said unit files from said first storage unit and said dynamic control data from said second storage unit so as to substitute said dummy data of said control data with said dynamic control data in said sub-file for each of said unit files to thereby generate substituted control data; and a restoration processor which accepts said compressed data row and said substituted control data from said control data generation unit for each of said unit files so as to restore said compressed data rows with use of said substituted control data to thereby generate restored data rows.

2. The compressed data restoration apparatus according to claim 1, wherein said substituted control data generation unit comprises:
a separation unit for separating said unit files read out from said first storage unit into said compressed data rows and said control data to provide said compressed data rows as its output to said restoration processor;
an array unit for allowing sequence of output of each of said dynamic control data read out collectively from said second storage unit to coincide with a sequence of output from said separation unit of said dummy data to be substituted with said dynamic control data; and
a substitution unit for substituting said dummy data output from said separation unit with said dynamic control data output one after another from said array unit to generate the substituted control data which is provided to said restoration processor.

3. The compressed data restoration apparatus according to claim 2, wherein said array unit comprises a temporary storage unit for temporarily storing said dynamic control data read out from said second storage unit to output said dynamic control data in a sequence of storage thereof.

4. The compressed data restoration apparatus according to claim 3, wherein a sequence of array of said unit files in said main file coincides with a sequence of array of said dynamic control data corresponding to said unit files in said sub-file.

5. The compressed data restoration apparatus according to claim 3, wherein said array unit comprises a re-array unit for controlling the sequence of said dynamic control data to be input to said temporary storage unit.

6. The compressed data restoration apparatus according to claim 1, wherein in said main file, each of said unit files contains, as headers of said control data and of said compressed data row, positional information indicative of a location to store said control data and said compressed data row in said restoration processor.

7. The compressed data restoration apparatus according to claim 6, wherein said substituted control data generation unit comprises:
a separation unit for separating said unit files read out from said first storage unit into said compressed data rows and said control data to provide said compressed data rows as its output to said restoration processor;
an array unit for allowing a sequence of output of each of said dynamic control data read out collectively from said second storage unit to coincide with a sequence of output from said separation unit of said dummy data to be substituted with said dynamic control data; and
a substitution unit for substituting said dummy data output from said separation unit with said dynamic control data output one after another from said array unit to generate the substituted control data which is provided to said restoration processor.

8. The compressed data restoration apparatus according to claim 1, wherein, in case that said unit files contain said positional information, said separation unit judges as to whether particular data is the control data or the compressed data row on the basis of respective positional information on said control data and said compressed data row of said unit files.

9. The compressed data restoration apparatus according to claim 7, wherein, in case that said unit files contain said positional information, said substitution unit comprises:

a decoder for judging whether particular control data is said dummy data or not on the basis of said positional information on said control data, to issue a substitute instruction signal if said control data is said dummy data; and a multiplexer for substituting said dummy data with said dynamic control data in response to said substitute instruction signal.

10. The compressed data restoration apparatus according to claim 1, wherein
said control data includes a quantity of data of said source data row and a quantity of data of said compressed data row, and wherein
said dynamic control data includes a quantity of data of said compressed data row.

11. The compressed data restoration apparatus according to claim 1, wherein
said substituted control data generation unit reads out a portion of said unit files in said main file selectively from said first storage unit, and wherein
said substituted control data generation unit reads out said dynamic control data in said sub-file corresponding to said portion of unit files selectively from said second storage unit.

12. The compressed data restoration apparatus according to claim 1, wherein
said source data row is test pattern data for testing semiconductor integrated circuits.

13. A semiconductor tester provided with a compressed data restoration apparatus designed to restore a plurality of compressed data rows transferred, to generate test pattern data for testing semiconductor integrated circuits, said compressed data restoration apparatus comprising:
a first storage unit for storing therein a main file composed of a plurality of unit files each including a compressed data row and control data required for restoration thereof, each unit file being provided for each compressed data row, said main file containing dummy data in place of dynamic control data to be acquired after generation of the compressed data rows;
a second storage unit for storing therein a sub-file containing the dynamic control data acquired from the control data for the compressed data rows after generation of the compressed data rows;
a substituted control data generation unit which, upon generation of restored data rows by restoration of said compressed data rows, reads out said unit files from said first storage unit and said dynamic control data from said second storage unit so as to substitute said dummy data of said control data with said dynamic control data in said sub-file for each of said unit files to thereby generate substituted control data; and
a restoration processor which accepts said compressed data row and said substituted control data from said control data generation unit for each of said unit files so as to restore said compressed data rows with use of said substituted control data to thereby generate restored data rows.

14. The semiconductor tester according to claim 13, wherein
said substituted control data generation unit comprises:
a separation unit for separating said unit files read out from said first storage unit into said compressed data rows and said control data to provide said compressed data rows as its output to said restoration processor;
an array unit for allowing a sequence of output of each of said dynamic control data read out collectively from said second storage unit to coincide with a sequence of output from said separation unit of said dummy data to be substituted with said dynamic control data; and
a substitution unit for substituting said dummy data output from said separation unit with said dynamic control data output one after another from said array unit to generate, the substituted control data which is provided to said restoration processor.

15. The semiconductor tester according to claim 13, wherein
in said main file, each of said unit files contains, as headers of said control data and of said compressed data row, positional information indicative of a location to store said control data and said compressed data row in said restoration processor.

16. The semiconductor tester according to claim 15, wherein
said substituted control data generation unit comprises:
a separation unit for separating said unit files read out from said first storage unit into said compressed data rows and said control data to provide said compressed data rows as its output to said restoration processor;
an array unit for allowing a sequence of output of each of said dynamic control data read out collectively from said second storage unit to coincide with a sequence of output from said separation unit of said dummy data to be substituted with said dynamic control data; and
a substitution unit for substituting said dummy data output from said separation unit with said dynamic control data output one after another from said array unit to generate the substituted control data which is provided to said restoration processor.

17. The semiconductor tester according to claim 16, wherein, in case that said unit files contain said positional information,
said separation unit judges as to whether particular data is the control data or the compressed data row on the basis of respective positional information on said control data and said compressed data row of said unit files.

18. The semiconductor tester to claim 16, wherein, in case that said unit files contain said positional information, said substitution unit comprises:
a decoder for judging whether particular control data is said dummy data or not on the basis of said positional information on said control data, to issue a substitute instruction signal if said control data is said dummy data; and
a multiplexer for substituting said dummy data with said dynamic control data in response to said substitute instruction signal.

19. A data compression/restoration method comprising the steps of:
producing a plurality of compressed data rows through a compression process of a plurality of source data rows:
generating a main file which contains the plurality of compressed data rows, and a sub-file which contains dynamic control data acquired after generation of the compressed data rows from control data required for restoration of the compressed data rows;
substituting dummy data with the dynamic control data in the sub-file for each compressed data to generate the substituted control data, and
restoring the compressed data rows with use of the substituted control data associated therewith.

20. The data compression/restoration method according to claim 19, wherein, for generation of said substituted control data,
a sequence of restoration of said compressed data rows is caused to coincide with a sequence of array immediately before substitution of said dynamic control data corresponding to said compressed data row.

* * * * *